United States Patent
Tsai et al.

(10) Patent No.: US 9,385,040 B2
(45) Date of Patent: Jul. 5, 2016

(54) METHOD OF MANUFACTURING A SEMICONDUCTOR DEVICE

(71) Applicant: TAIWAN SEMICONDUCTOR MANUFACTURING COMPANY LTD., Hsinchu (TW)

(72) Inventors: Tsai-Tsung Tsai, Taoyuan County (TW); Wen-Hsiung Lu, Taipei County (TW); Yu-Peng Tsai, Taipei (TW); Wei-Hung Lin, Hsinchu County (TW); Ming-Da Cheng, Hsinchu County (TW); Chung-Shi Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/183,870

(22) Filed: Feb. 19, 2014

(65) Prior Publication Data

US 2015/0235902 A1    Aug. 20, 2015

(51) Int. Cl.
*H01L 21/78* (2006.01)
*H01L 21/683* (2006.01)
*H01L 23/00* (2006.01)
*H01L 23/544* (2006.01)

(52) U.S. Cl.
CPC ............ *H01L 21/78* (2013.01); *H01L 21/6836* (2013.01); *H01L 23/544* (2013.01); *H01L 24/81* (2013.01); *H01L 2221/6834* (2013.01); *H01L 2221/68313* (2013.01); *H01L 2221/68327* (2013.01); *H01L 2221/68381* (2013.01); *H01L 2223/54426* (2013.01); *H01L 2223/54433* (2013.01); *H01L 2223/54486* (2013.01); *H01L 2224/16225* (2013.01); *H01L 2924/12042* (2013.01); *H01L 2924/15311* (2013.01)

(58) Field of Classification Search
CPC ............... H01L 21/0201; H01L 21/02013; H01L 21/02016; H01L 21/67242; H01L 21/67265; H01L 2223/54473; H01L 21/78; H01L 24/81; H01L 23/544; H01L 21/6836; H01L 2221/68313; H01L 2221/68381
See application file for complete search history.

(56) References Cited

U.S. PATENT DOCUMENTS

| | | | |
|---|---|---|---|
| 6,342,912 B1 * | 1/2002 | Corbett | B23K 26/0823 257/E23.179 |
| 7,015,064 B1 * | 3/2006 | Patwardhan et al. | 438/106 |
| 2011/0123093 A1 * | 5/2011 | Alloo | G01N 25/72 382/149 |
| 2012/0018854 A1 * | 1/2012 | Kato et al. | 257/622 |
| 2012/0028415 A1 * | 2/2012 | Shiga et al. | 438/113 |
| 2013/0328217 A1 * | 12/2013 | Takamoto et al. | 257/778 |

FOREIGN PATENT DOCUMENTS

TW    201141646 A1    12/2011

OTHER PUBLICATIONS

The official action with No. 10520180880 issued by Taiwan Property Intellectual Office on Feb. 17, 2016.

* cited by examiner

*Primary Examiner* — Thanhha Pham
(74) *Attorney, Agent, or Firm* — Chun-Ming Shih (57) ABSTRACT

A method of manufacturing a semiconductor device includes providing a wafer, grinding a backside of the wafer, disposing a backside film on the backside of the wafer, cutting the wafer to singulate a plurality of dies from the wafer, and forming a mark on the backside film disposed on each of the plurality of dies by a laser operation.

20 Claims, 13 Drawing Sheets

FIG. 2I

METHOD OF MANUFACTURING A SEMICONDUCTOR DEVICE

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level chip scale packaging (WLCSP) is widely used for its low cost and relatively simple manufacturing operations. During the WLCSP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. Such circumstances have created many challenges for modifying a structure of the semiconductor devices and improving the manufacturing operations. The small and thin semiconductor device would have a warpage issue during the manufacturing operations. The semiconductor device is produced in a undesired configuration. The undesired configuration would lead to a high yield loss of the semiconductor device. The high yield loss would further exacerbate materials wastage and thus increase the manufacturing cost.

Thus, there is a continuous demand on simplifying the steps of production and improving the method of manufacturing the semiconductor device in order to minimize an effect of the warpage on the manufacturing operations and a yield loss of the assembled semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die is manufactured by a number of operations. A number of dies are produced and sawed from a piece of wafer. Before sawing the dies from the wafer, the wafer has to be gone through several manufacturing operations. During the manufacturing operations of the wafer, a backside of the wafer is ground to reduce its thickness, then a mark would be engraved on each of the dies.

As the wafer has been thinned down, such a thin wafer would have warpage easily during subsequent operations. Thus, the wafer has to be coated with a backside film or has to be mounted on a frame by a dicing tape in order to support the thin wafer after the grinding operations. The mark would be engraved on the backside film disposed on the backside of each of the dies by projecting a laser beam on the backside film through the dicing tape.

However, the laser beam is not directly projected on the backside film disposed on the die to engrave the mark on the die. The laser beam has to pass through the dicing tape before reaching the backside film disposed on the backside of the die. As the laser beam is projected on the dicing tape, some of the dicing tape would be peeled off. These residual tape would blur the mark and thus the mark could not be clearly seen. The die with a blurred mark would be eliminated from subsequent manufacturing operations and thus would cause material wastage.

Furthermore, as the mark on the die would be used for alignment or identification during subsequent operations, the die with the blurred mark would not be aligned accurately or would not be identified correctly by machines upon subsequent operation, and thus would potentially have a high yield loss or poor reliability.

The disclosure relates to a method of manufacturing a semiconductor device. In the present disclosure, the semiconductor device produced by an improved laser marking operation is disclosed. The method of manufacturing includes singulating a number of dies from a wafer and then laser marking on a backside film disposed on a backside of each of the dies individually. As a laser beam is projected directly on the backside film and the laser marking is performed on an individual die, the mark is clearly engraved on the backside film and no residue is disposed on or adjacent to the mark. Therefore, a performance of the laser marking is improved.

Figure 1:
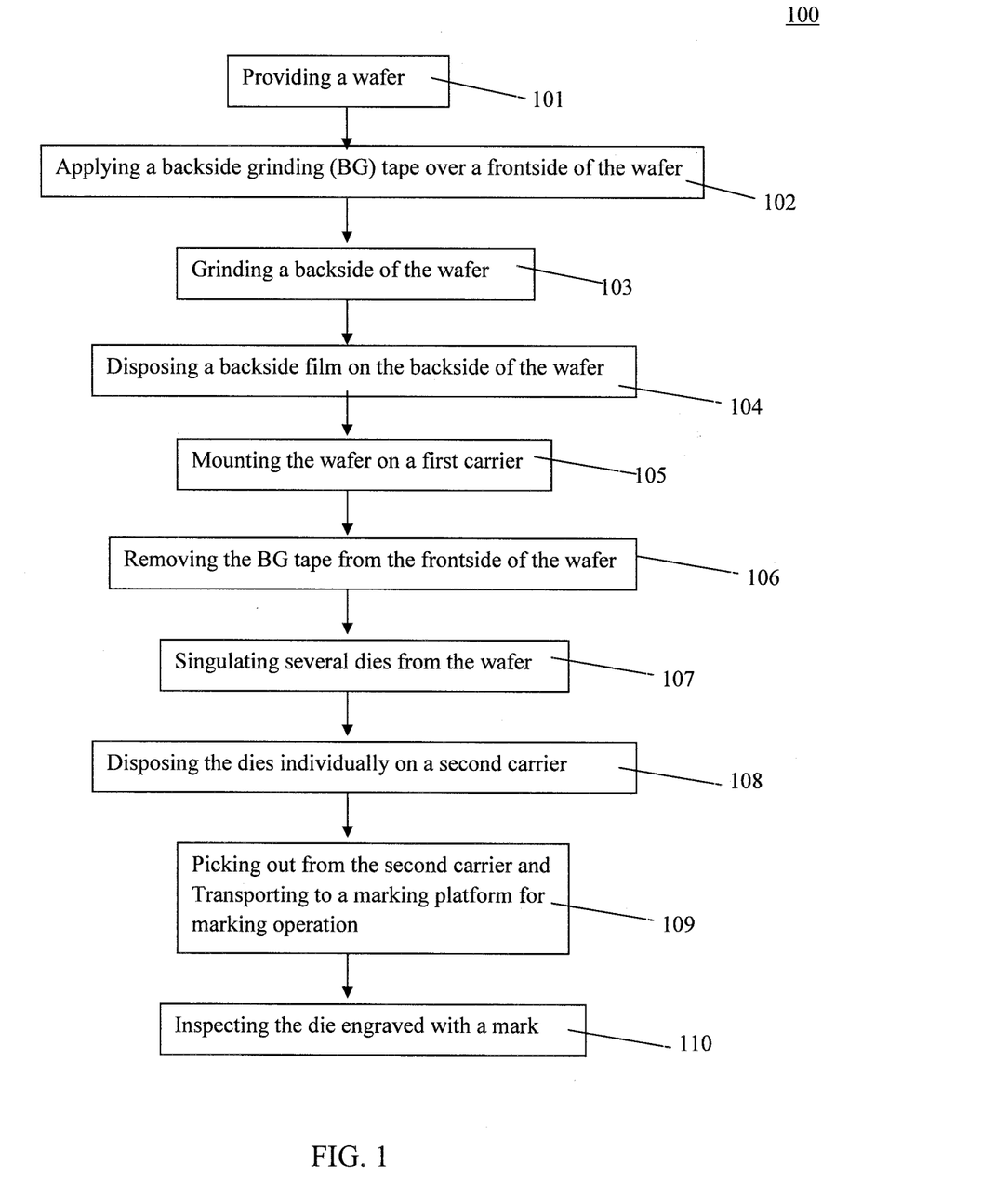
FIG. 1 is a flow diagram of a method of manufacturing a semiconductor device in accordance with some embodiments.

FIG. 1 is a flowchart of a method 100 of manufacturing a semiconductor device in accordance with various embodiments of the present disclosure. The method 100 includes a number of operations (101, 102, 103, 104, 105, 106, 107, 108, 109 and 110).

Figure 1A:
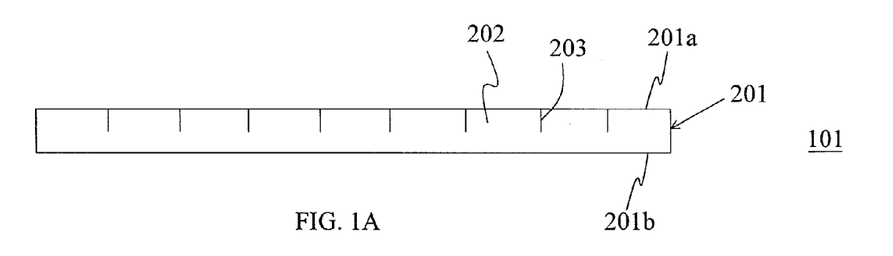
FIG. 1A is a schematic view of a wafer with several partially sawed dies in accordance with some embodiments.

In operation 101, a wafer 201 is provided as in FIG. 1A. In some embodiments, the wafer 201 includes semiconductor materials such as silicon, germanium, gallium, arsenice, indium phosphide or combinations thereof. In some embodiments, the wafer 201 is mounted to a substrate including a sacrificial base material such as silicon, polymer or other suitable materials for supporting the wafer 201. In some embodiments, an adhesive film is disposed over a surface of the substrate for temporarily bonding the wafer 201 on the substrate. In some embodiments, the wafer 201 has a thickness of about 400 um to about 800 um.

Figure 1B:
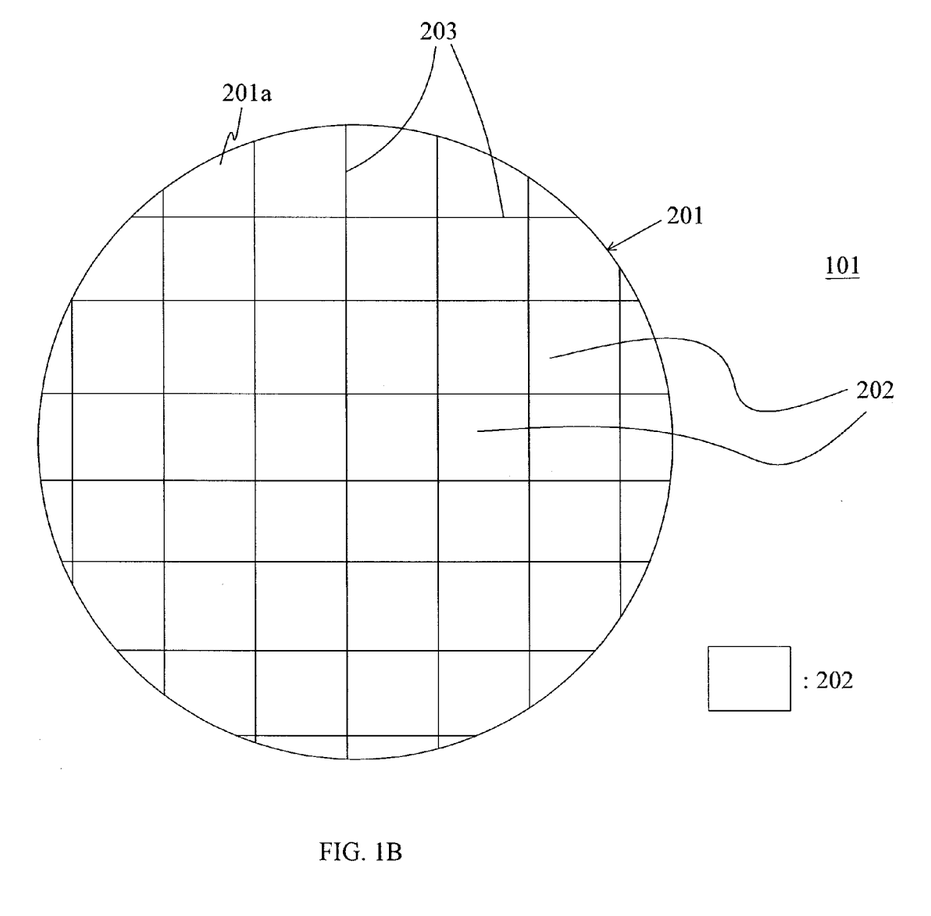
FIG. 1B is a top view of a wafer with several partially sawed dies in accordance with some embodiments.

In some embodiments, the wafer 201 is in a circular shape as shown in FIG. 1B which is a top view of the wafer 201 of FIG. 1A. In some embodiments, the wafer 201 is in quadrilateral or polygonal shape.

In some embodiments, the wafer 201 includes a number of dies 202. In some embodiments, the dies 202 are arranged in a matrix or an array over the wafer 201. In some embodiments, each die 202 is in a rectangular or quadrilateral shape. In some embodiments, the dies 202 are partially cut along several scribe lines 203, so that the dies 202 are still disposed on the wafer 201 and arranged in a regular array as shown in FIG. 1B.

Each of the dies 202 are formed on a surface of the wafer 201 by a number of front end manufacturing operations, which are generally known to a skilled person in the art. In some embodiments, the die 202 includes several electrical circuits. The electrical circuits formed within the die 202 may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like.

In some embodiments, each die 202 includes active and passive electrical components. The active and passive electrical components are connected with each other to form a variety of functional electrical circuits. In some embodiments, the die 202 includes several active components such as transistors or diodes to control a flow of an electric current. In some embodiments, the die 202 includes several passive components such as capacitors or resistors to provide voltage for performing particular electrical functions. In some embodiments, the active and passive components are formed on the wafer 201 by various methods such as doping, photolithography, etching or etc.

In some embodiments, the electrical circuits are interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

Figure 1C:
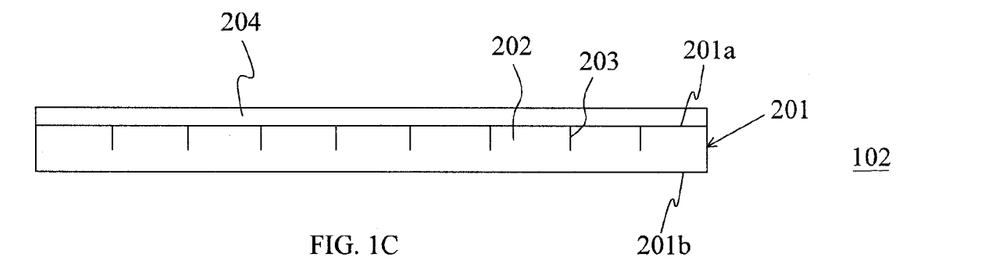
FIG. 1C is a schematic view of a wafer with a backside grinding (BG) tape in accordance with some embodiments.

In operation 102, a backside grinding (BG) tape 204 is disposed over a frontside 201a of the wafer 201 as in FIG. 1C. In some embodiments, the frontside 201a of the wafer 201 is an active surface of the wafer 201 where several conductive bumps are disposed. In some embodiments, each of the conductive bumps is disposed on a bump pad of the wafer 201. The bump pad is disposed on the active surface 201a of the wafer 201.

In some embodiments, the conductive bumps are configured for establishing an electrical interconnection between the wafer 201 and other external semiconductor device. In some embodiments, the conductive bumps are arranged in an array on the frontside 201a of the wafer 201. In some embodiments, the conductive bumps include solder material such as tin, lead, silver, copper or combinations thereof. In some embodiments, the conductive bumps are formed on the active surface 201a of the wafer 201 by any suitable operations such as ball drop, electroplating, screen printing or etc.

In some embodiments, the BG tape 204 is laminated on the frontside 201a of the wafer 201 so as to protect the active surface 201a or the conductive bumps disposed on the active surface 201a from damages and contamination caused by a subsequent backside grinding operation. In some embodiments, the BG tape 204 covers the frontside 201a and is conformal to a gap between adjacent conductive bumps disposed on the wafer 201.

In some embodiments, the BG tape 204 is strongly adhered to the frontside 201a of the wafer 201 upon application, while the BG tape 204 is easily peeled off from the wafer 201 after exposure to an ultra violet (UV) radiation. In some embodiments, the BG tape 204 is UV or heat curable. In some embodiments, the BG tape 204 includes polyethylene terephthalate (PET). In some embodiments, the BG tape 204 is optically translucent.

Figure 1D:
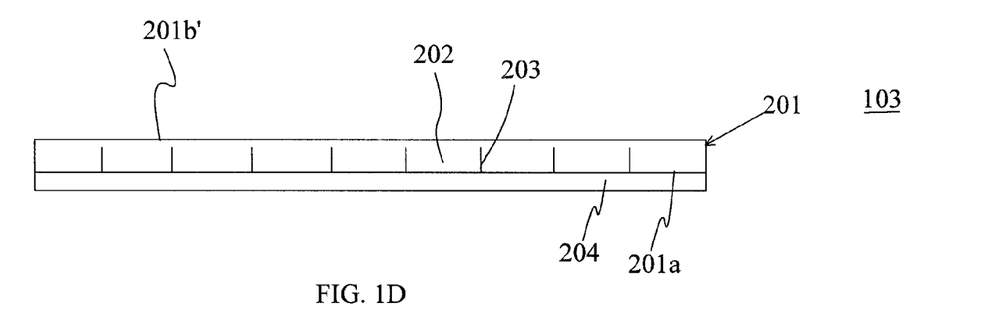
FIG. 1D is a schematic view of a wafer ground from its backside in accordance with some embodiments.

In operation 103, some of the backside 201b of the wafer 201 is ground as in FIG. 1D. After laminating the BG tape 204 on the frontside 201a of the wafer 201, the wafer 201 is flipped and ground from the backside 201b to thinner its thickness as shown in FIG. 1D. In some embodiments, some of the backside 201b of the wafer 201 is ground to become a new backside 201b', and thus the thickness of the wafer 201 is reduced.

In some embodiments, some of the backside 201b are removed by plasma etching, chemical mechanical planarization (CMP) or a mechanical grinder. In some embodiments, the thickness of the wafer 201 is reduced to about 200 um to about 300 um. In some embodiments, the thickness of the wafer 201 is reduced to less than about 250 um.

Figure 1E:
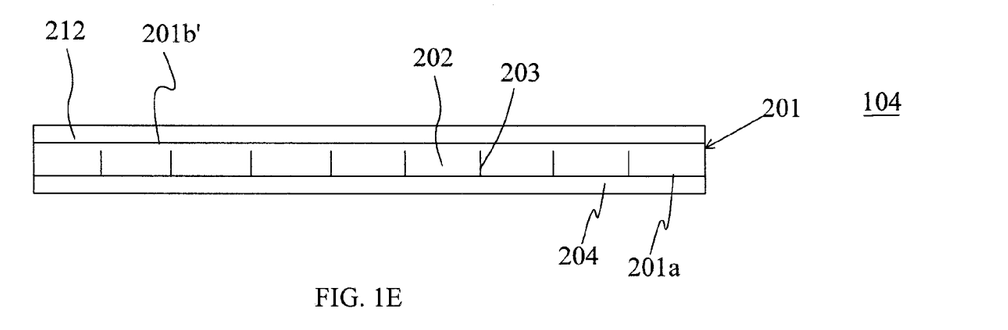
FIG. 1E is a schematic view of a backside film disposed on a backside of a wafer in accordance with some embodiments.

In operation 104, a backside film 212 is disposed on the new backside 201b' of the wafer 201 as in FIG. 1E. In some embodiments, the backside film 212 is permanently disposed on the new backside 201b' of the wafer 201. In some embodiments, the backside film 212 is permanently attached to the new backside 201b' of the wafer 201 after a curing operation. In some embodiments, the backside film 212 is a non-cured backside film. The backside film 212 is attached to the new backside 201b' without a curing operation. Thus, the curing operation is not necessary for the backside film 212. In some embodiments, the backside film 212 is configured for protecting the wafer 201 and the dies 202 against cracking and warpage.

In some embodiments, the backside film 212 is a polymeric composite film. In some embodiments, the backside film 212 includes epoxy, polymer, polyimide or etc. In some embodiments, the backside film 212 includes a pigment or colorant in order to provide a sufficient contrast between a mark on the die 202 and the backside 201b' of the die 202, such that a clearer mark is formed on the backside 201b' of each die 202 by a subsequent laser marking operation. In some embodiments, the backside film 212 has a surface roughness (Ra) of less than about 5 um.

Figure 1F:
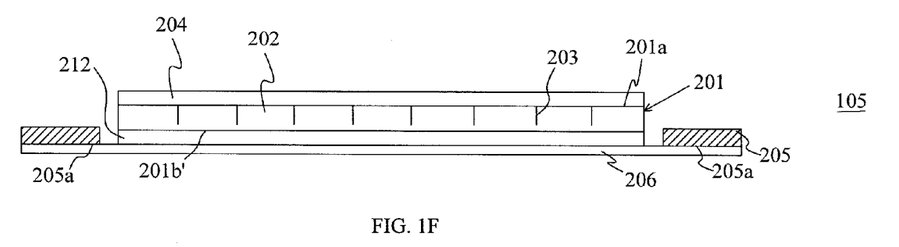
FIG. 1F is a schematic view of a wafer mounted on a first carrier in accordance with some embodiments.
Figure 1G:
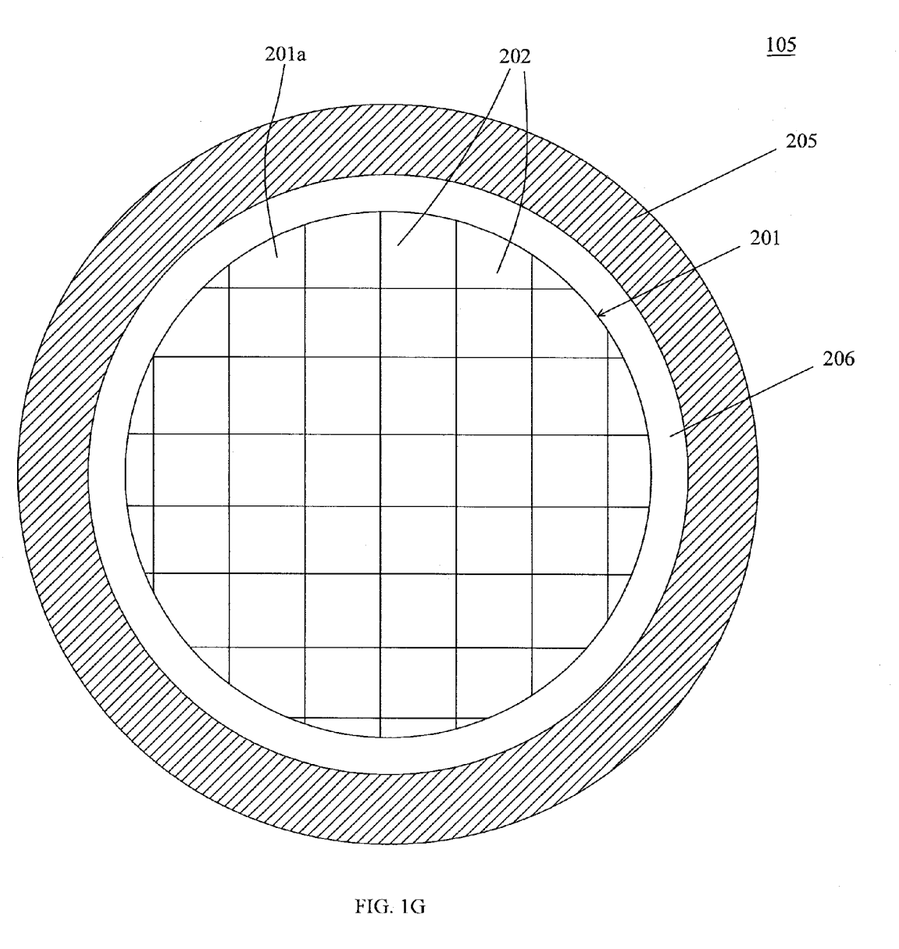
FIG. 1G is a top view of a wafer mounted on a first carrier in accordance with some embodiments.

In operation 105, the wafer 201 is mounted on a first carrier 205 as in FIG. 1F and FIG. 1G. In some embodiments, the wafer 201 is flipped and then mounted on the first carrier 205 by a dicing tape 206. In some embodiments, the wafer 201 is temporarily bonded on the first carrier 205 by the dicing tape 206. The backside film 212 disposed on the new backside 201b' of the wafer 201 is attached with the dicing tape 206. The frontside 201a of the wafer 201 is facing upward. In some embodiments, a bottom periphery 205a of the first carrier 205 is attached with the dicing tape 206. Therefore, the wafer 201 is mounted on and supported by the first carrier 205. In some embodiments, the dicing tape 206 includes epoxy.

In some embodiments, the wafer 201 is disposed concentric with the first carrier 205 as shown in FIG. 1G which is a top view of FIG. 1F. In some embodiments, the first carrier 205 is a ring shaped frame as in FIG. 1G. In some embodiments, the first carrier 205 is a sheet metal frame. In some embodiments, the first carrier 205 is a dicing ring which is configured for holding the wafer 201 for subsequent die sawing operation. In some embodiments, the wafer 201 is circumscribed by the first carrier 205.

Figure 1H:
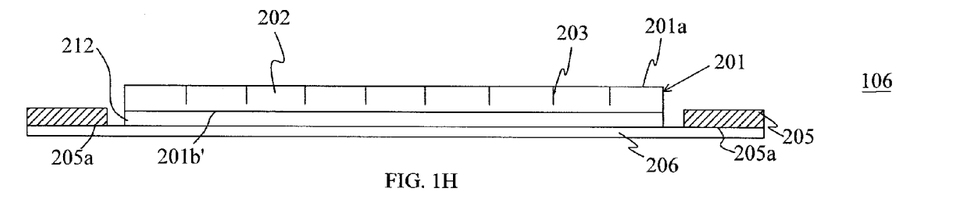
FIG. 1H is a schematic view of a wafer mounted on a first carrier without a backside grinding (BG) tape in accordance with some embodiments.

In operation 106, the BG tape 204 is removed from the wafer 201 as in FIG. 1H. In some embodiments, the BG tape 204 is peeled off after an exposure of UV light. In some embodiments, the BG tape 204 is removable after a heat treatment. The frontside 201a is exposed after removing the BG tape 204.

Figure 1I:
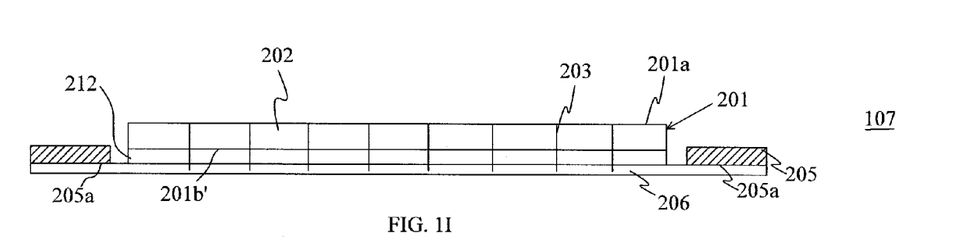
FIG. 1I is a schematic view of a wafer with several completely sawed dies in accordance with some embodiments.

In operation 107, the wafer 201 is cut to singulate a number of dies 202 from the wafer 201 as in FIG. 1I. In some embodiments, the wafer 201 is sawed by a mechanical or laser blade along the scribe lines 203 between adjacent dies 202. In some embodiments, the wafer 201 has been partially cut along the scribe lines 203 as shown in FIG. 1A, then the wafer 201 is sawed completely to separate each of the dies 202 from the wafer 201 as shown in FIG. 1I. In some embodiments, the blade is sawed through the backside film 212 and into the dicing tape 206, such that the dies 202 are singulated from the wafer 201 while still attached to the first carrier 205 by the dicing tape 206 and maintained on the dicing tape 206.

In some embodiments, a step of partial cutting of the wafer 201 as in FIG. 1A and FIG. 1B is eliminated, that the dies 202 are sawed and singulated out from the wafer 201 by a complete sawing only. The wafer 201 is cut after mounting the wafer 201 on the first carrier 205. In some embodiments, the dies 202 are attached to the first carrier 205 and maintained on the dicing tape 206 after the complete sawing by an adhesive strength of the dicing tape 206. In some embodiments, the dies 202 are completely sawed by a mechanical or laser blade.

In some embodiments, each die 202 is undergone an inspection after singulation. The dies 202 are still attached on the first carrier 205 after the singulation, then the wafer 201 arranged with the singulated dies 202 is transported to an inspection equipment for inspecting each die 202 on the first carrier 205.

Figure 1J:
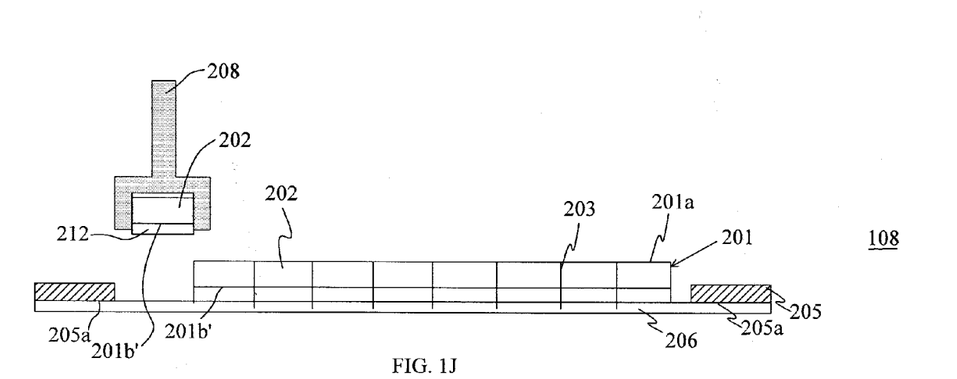
FIG. 1J is a schematic view of a singulated die picked out of a first carrier in accordance with some embodiments.
Figure 1K:
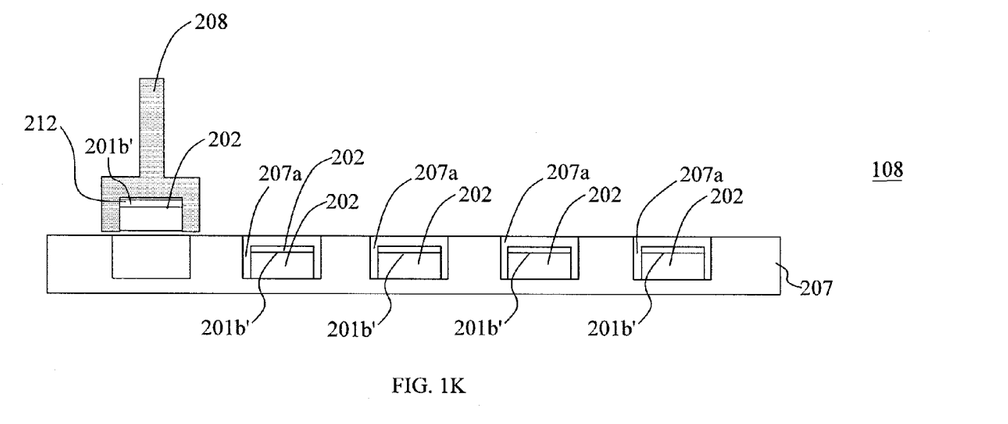
FIG. 1K is a schematic view of a die placed into a cavity of a second carrier in accordance with some embodiments.

In operation 108, the dies 202 are individually disposed on a second carrier 207 as in FIG. 1J and FIG. 1K. In some embodiments, each of the dies 202 singulated from the wafer 202 is picked out from the first carrier 205 and loaded to the second carrier 207. In some embodiments, the singulated dies 202 are lifted up by a first holder 208 and detached from the dicing tape 206 one by one as shown in FIG. 1J, and then transported from the first carrier 205 to the second carrier 207 to dispose and load the dies 202 into cavities 207a of the second carrier 207 respectively as shown in FIG. 1K.

In some embodiments, the first holder 208 is controlled by an automatic pick and place equipment. In some embodiments, the holder 208 holds and flips the die 202 before disposing the die 202 into the cavity 207a, so that the backside 201b' of the die 202 is faced upward.

Figure 1L:
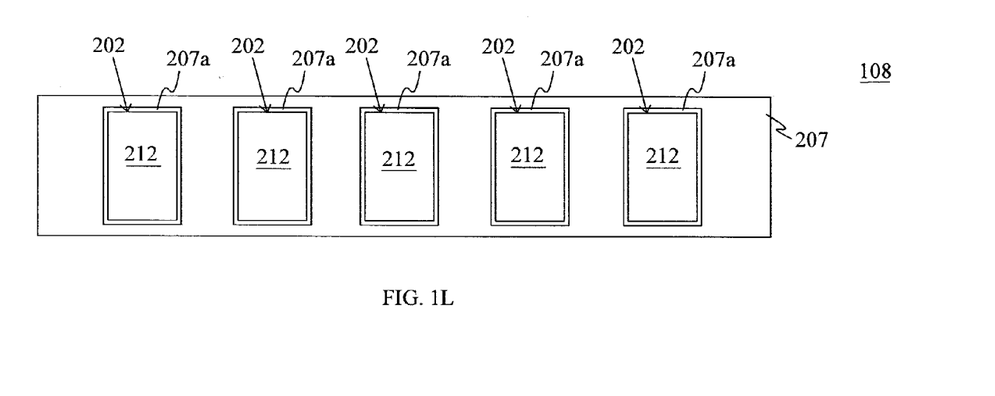
FIG. 1L is a top view of a second carrier with several singulated dies in accordance with some embodiments.

In some embodiments, the cavities 207a of the second carrier 207 are consistent with each other, so that one of the dies 202 can be placed and fitted into any one of the cavities 207a of the second carrier 207. In some embodiments, the second carrier 207 is a carrier tape. In some embodiments, the second carrier 207 is an elongated tape in a rectangular shape as shown in FIG. 1L which is a top view of FIG. 1K. In some embodiments, each of the cavities 207a is in a quadrilateral, circular or polygonal shape. In some embodiments, the shape of the cavity 207a is conformal to the shape of the die 202 to be disposed. In some embodiments, the second carrier 207 includes plastic or antistatic materials.

In some embodiments, the second carrier 207 has a flexibility to be bended and winded up. In some embodiments, the second carrier 207 is winded up on a reel after loading the dies 202 into the cavities 207a. In some embodiments, a cover tape is disposed on the second carrier 207 to cover and protect the dies 202 within the cavities 207a. In some embodiments, the second carrier 207 carrying the dies 202 is transported to a subsequent operation. In some embodiments, the second carrier 207 covered by the cover tape is winded up on the reel and transported for subsequent marking operation.

Figure 1M:
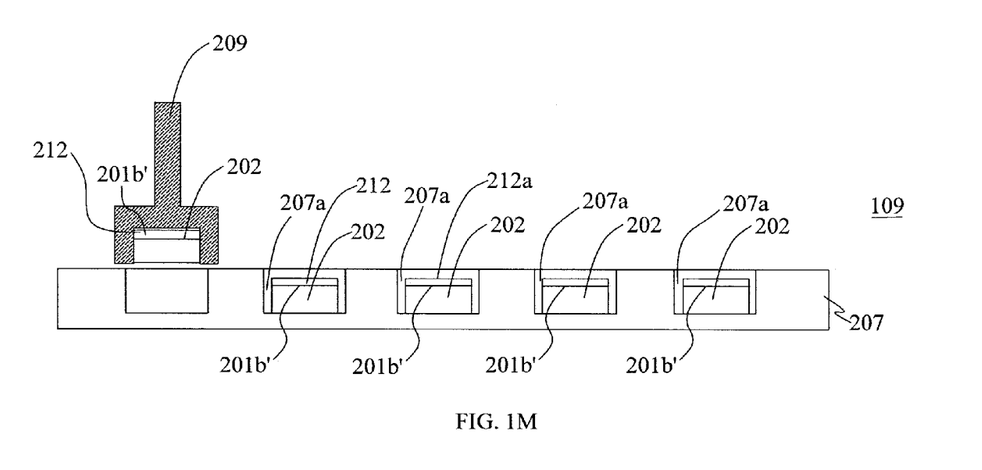
FIG. 1M is a schematic view of a die picked out from a second carrier in accordance with some embodiments.
Figure 1N:
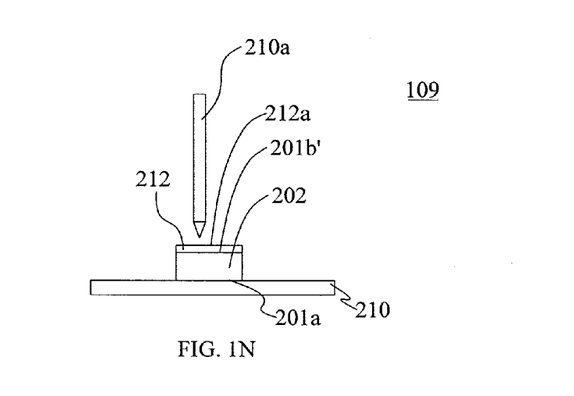
FIG. 1N is a schematic view of a die under a laser marking operation in accordance with some embodiments.

In operation 109, the dies 202 in the cavities 207a of the second carrier 207 are picked out and transported to a predetermined position for marking operation as in FIG. 1M and FIG. 1N. In some embodiments, the dies 202 are unloaded from the cavities 207a of the second carrier 207 one by one, and then transported to a marking platform 210 to engrave a mark on the backside film 212 disposed on the backside 201b' of the die 202.

In some embodiments, the mark is formed on the backside film 212 disposed on the backside 201b' of each of the dies 202 by a laser operation. In some embodiments, the marking platform 210 includes a laser beam 210a projecting directly on the backside film 212 disposed on the backside 201b' of the die 202 placed on the marking platform 210 to engrave the mark on the backside film 212 disposed on the backside 201b' of each of the dies 202. In some embodiments, the backside film 212 is exposed to the laser beam 210a to laser engrave the mark on the backside film 212. In some embodiments, the mark is formed on the backside film 212 by the laser beam 210a with a wavelength of about 200 nm to about 600 nm.

In some embodiments, the mark engraved on the backside film 212 includes a character, a letter, an alphabet, a symbol, a mark, a logo, a trademark, a pattern or combinations thereof. In some embodiments, the mark is engraved into the backside film 212 with a depth from a top surface 212a of the backside film 212 towards the backside 201b'. In some embodiments, the mark is engraved into the backside film 212 with the depth of about 0.001 um to about 50 um from the backside film 212. In some embodiments, the depth of the mark from the backside film 212 is less than about 10 um.

In some embodiments, the mark engraved on the backside film 212 has a depth uniformity which is a difference between a maximum depth and a minimum depth of the mark engraved into the backside film 212 towards the backside 201b' of the die 202. In some embodiments, the mark engraved into the backside film 212 has the depth uniformity of less than about 20 um. In some embodiments, the depth uniformity of the mark engraved into the backside film 212 is less than about 10 um.

In operation 110, the die 202 engraved with the mark is inspected by an equipment. In some embodiments, the die 202 is inspected by an infra red (IR). In some embodiments, the die 202 is inspected by optical microscope (OM), scanning electron microscope (SEM) or any other suitable equipments. In some embodiments, five sides of the die 202 are inspected in a sequence by the suitable equipments. In some embodiments, the mark on the backside film 212 disposed on the backside 201b' of the die 202 is inspected by an operator through the OM.

Figure 2:
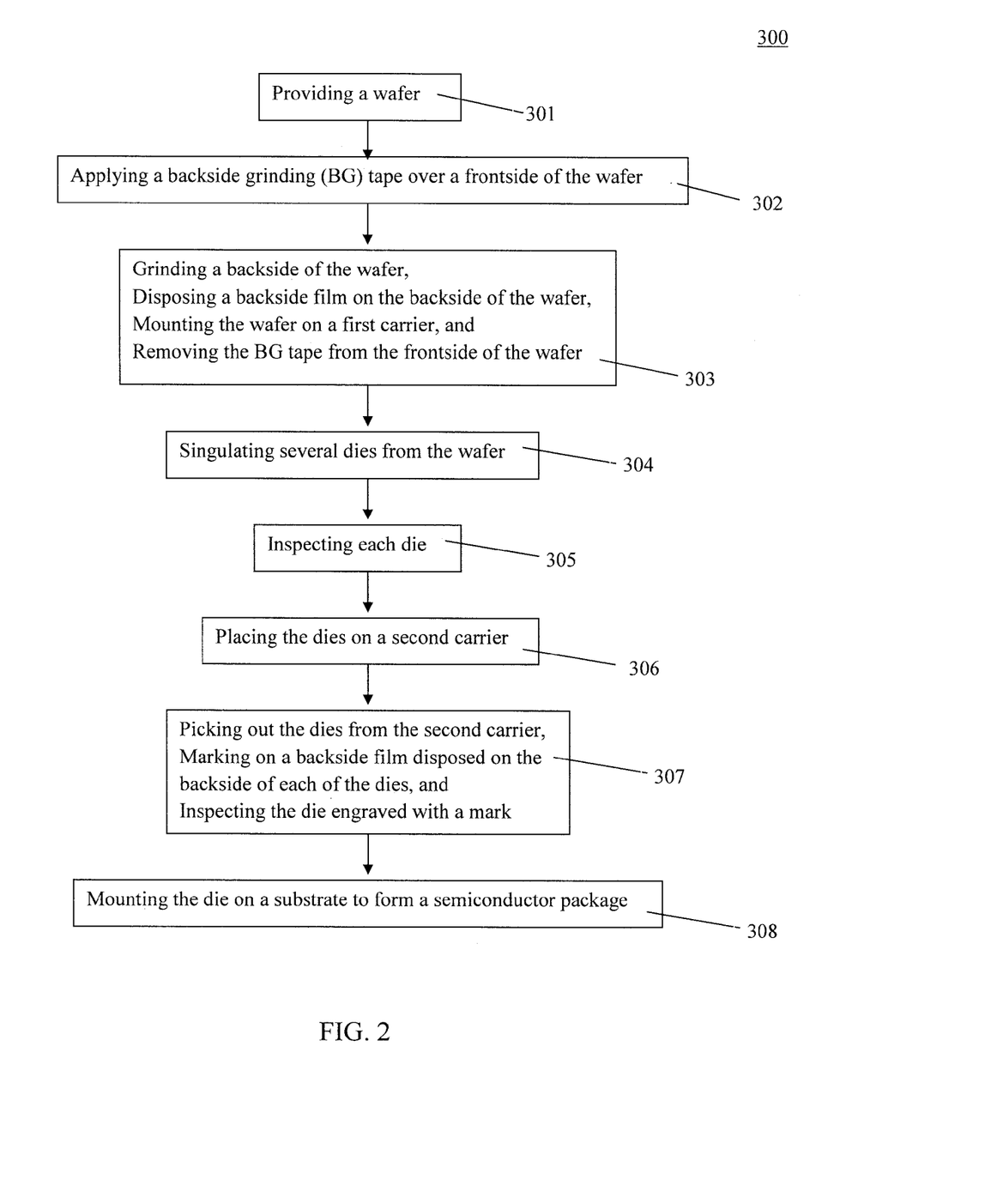
FIG. 2 is a flow diagram of a method of manufacturing a semiconductor device in accordance with some embodiments.

FIG. 2 is a flowchart of a method 300 of manufacturing a semiconductor device in accordance with various embodiments of the present disclosure. The method 300 includes a number of operations (301, 302, 303, 304, 305, 306, 307 and 308).

Figure 2A:
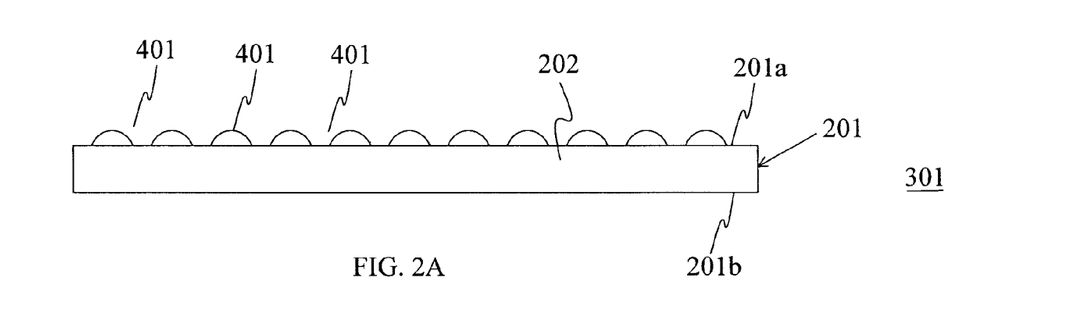
FIG. 2A is a schematic view of a wafer with several dies in accordance with some embodiments.

In operation 301, a wafer 201 is provided as in FIG. 2A. In some embodiments, the wafer 201 includes semiconductor materials such as silicon. In some embodiments, the wafer 201 has a thickness of about 400 um to about 800 um.

Figure 2B:
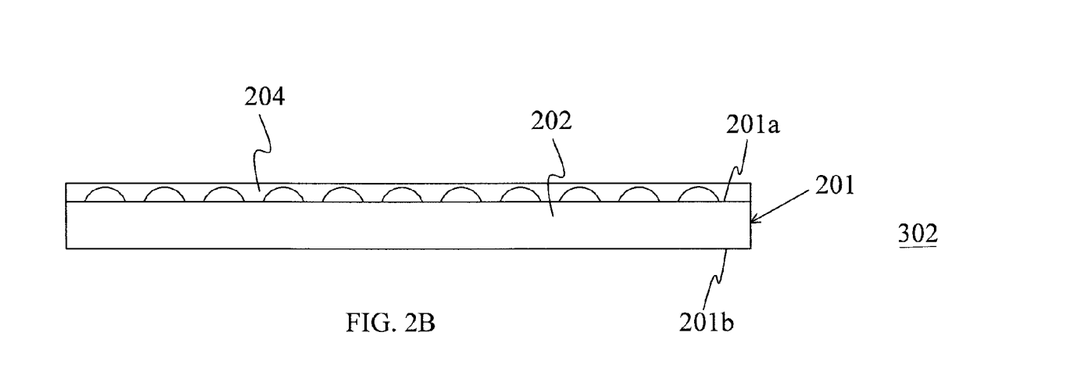
FIG. 2B is a schematic view of a wafer with a backside grinding (BG) tape in accordance with some embodiments.

In operation 302, a backside grinding (BG) tape 204 is disposed over a frontside 201a of the wafer 201 as in FIG. 2B. In some embodiments, the frontside 201a of the wafer 201 is disposed with several conductive die bumps 401. In some embodiments, the conductive die bumps 401 are configured for electrically connecting the die 202 to be singulated from the wafer 201 with an external device such as a substrate or a printed circuit board (PCB).

Figure 2C:
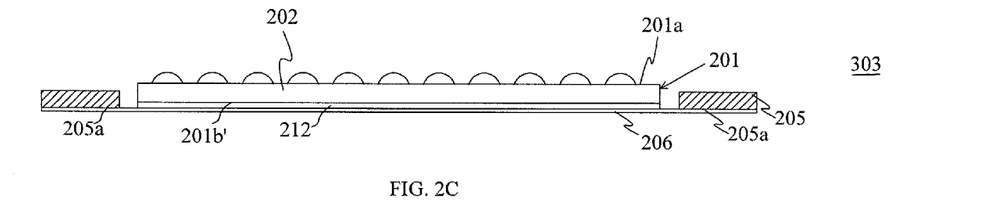
FIG. 2C is a schematic view of a ground wafer mounted on a first carrier in accordance with some embodiments.

In operation 303, some of the backside 201b of the wafer 201 is ground, and the ground wafer 201 is mounted on a first carrier 205 and the BG tape is removed from the frontside 201a of the die 201 as in FIG. 2C. In some embodiments, the operation 303 is implemented by a first machine.

In some embodiments, the first machine includes a grinding blade for grinding the backside 201b' of the wafer 201. In some embodiments, the wafer 201 is ground to reduce a thickness of less than about 250 um.

In some embodiments, the first machine includes a holder for flipping the ground wafer 201, so that the ground wafer 201 can be mounted on a first carrier 205. In some embodiments, a backside film 212 is disposed on a new backside 201b' of the wafer 201. In some embodiments, the backside film 212 includes polymer and provides protection for the wafer 201 against a cracking and warpage. In some embodiments, the backside film 212 is permanently attached to the new backside 201b' after a curing operation. In some embodiments, the backside film 212 is a non-cured backside film. A curing operation is not required for the backside film 212.

In some embodiments, the wafer 201 is attached with the first carrier 205 by a dicing tape 206. In some embodiments, the backside film 212 on the new backside 201b' of the ground wafer 201 is attached with the dicing tape 206. In some embodiments, the first carrier 205 is a dicing ring for supporting the ground and thin wafer 201 to be sawed. In some embodiments, the dicing tape 206 includes epoxy.

In some embodiments, the first machine includes an UV light. The wafer 201 mounted on the first carrier 205 is exposed to the UV light, then the BG tape 204 on the frontside 201a is peeled off. In some embodiments, the first machine includes a heater. The wafer 201 is heat treated by the heater to cure the BG tape 204, such that the BG tape 204 is removable from the frontside 201a of the wafer 201.

Figure 2D:
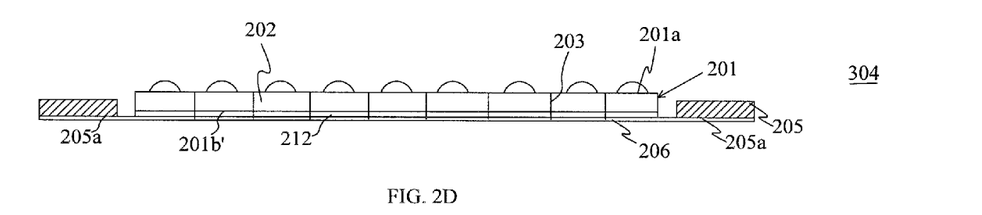
FIG. 2D is a schematic view of a wafer with several completely sawed dies in accordance with some embodiments.

In operation 304, the wafer 201 is cut to singulate a number of dies 202 from the wafer 201 as in FIG. 2D. In some embodiments, the first machine includes a mechanical or laser blade. The wafer 201 mounted on the first carrier 205 is sawed by the mechanical or laser blade along the scribe lines 203 between adjacent dies 202. The wafer 201 is sawed completely to separate each of the dies 202 from the wafer 201.

In some embodiments, the blade is sawed through the backside film 212 and into the dicing tape 206, such that the dies 202 are still attached to the first carrier 205 by the dicing tape 206 and maintained on the dicing tape 206 for subsequent operation.

In operation 305, each of the dies 202 sawed from the wafer 201 is undergone an inspection after singulation. The dies 202 are still attached on the first carrier 205 by the dicing tape 206 after singulation, then the wafer 201 arranged with the singulated dies 202 is transported from the first machine to an inspection station for checking and examining each die 202, such as defects on conductive bumps disposed on the die, cracks within the die or etc.

Figure 2E:
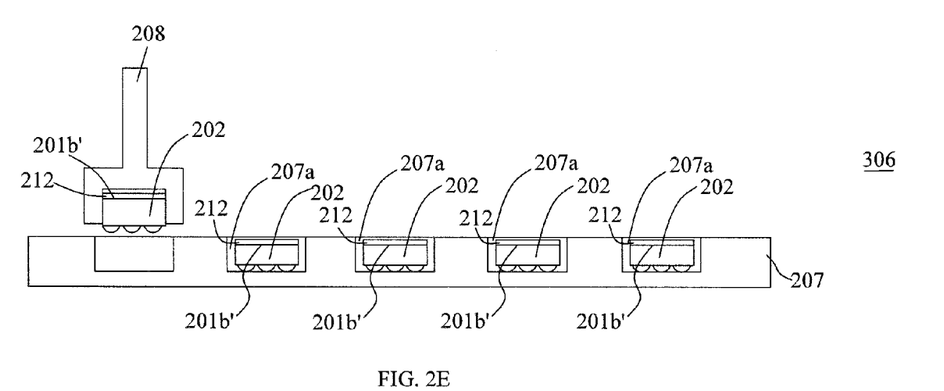
FIG. 2E is a schematic view of a die placed into a cavity of a second carrier in accordance with some embodiments.

In operation 306, the dies 202 are individually disposed on a second carrier 207 as in FIG. 2E. In some embodiments, each of the dies 202 is loaded to the second carrier 207 after the inspection. Each die 202 is transported from the first carrier 205 to the second carrier 207 to dispose and load the dies 202 into cavities 207a of the second carrier 207 respectively. In some embodiments, a first holder 208 holds and flips the die 202 before disposing the die 202 into the cavity 207a, so that the backside 201b' of the die 202 is faced upward.

Figure 2F:
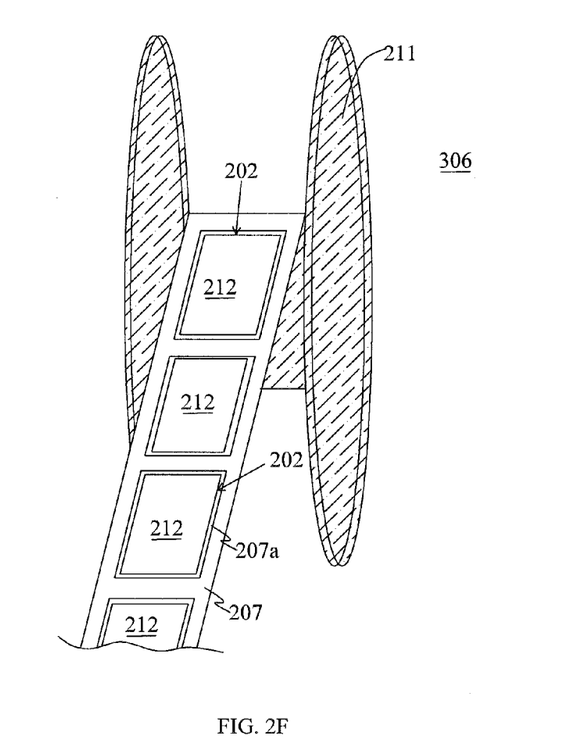
FIG. 2F is a schematic view of a second carrier wound up on a reel in accordance with some embodiments.

In some embodiments as in FIG. 2F, the second carrier 207 has a flexibility to be bended and winded up on a reel 211 after loading the dies 202 into the cavities 207a. In some embodiments, a cover tape is disposed on the second carrier 207 to cover and protect the dies 202 within the cavities 207a. In some embodiments, the second carrier 207 covered by the cover tape is winded up on the reel 211 and transported to a subsequent operation.

Figure 2G:
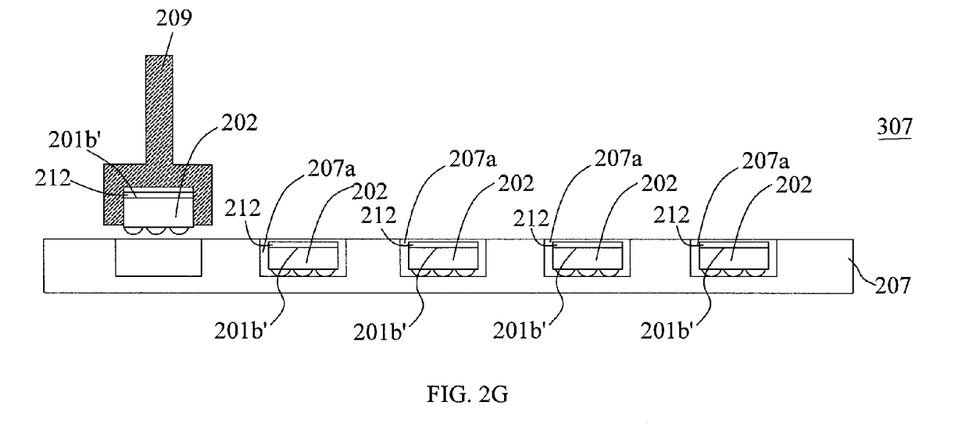
FIG. 2G is a schematic view of a die picked out from a second carrier in accordance with some embodiments.
Figure 2H:
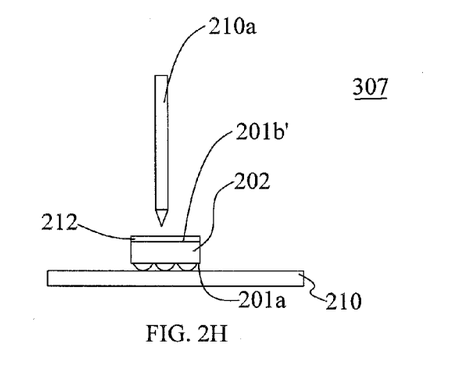
FIG. 2H is a schematic view of a die under a laser marking operation in accordance with some embodiments.

In operation 307, the dies 202 in the second carrier 207 wound up on the reel 211 are transported to a second machine and unloaded from the cavities 207a of the second carrier 207 for individual marking operation as in FIG. 2G and FIG. 2H.

In some embodiments, the second machine includes a second holder 209 for unloading the dies 202 from the cavities 207a one by one to a predetermined position.

In some embodiments, the second machine includes a laser marking platform 210. The die 202 unloaded from the cavity 207a is transported to the laser marking platform 210 to engrave a mark on the backside film 212 disposed on the backside 201b' of the die 202.

In some embodiments, the second machine includes a laser beam 210a for forming the mark on the backside film 212. In some embodiments, the die 202 is placed on the laser marking platform 210, and the laser beam 210a is projected directly on the backside film 212 to engrave the mark into the backside film 212. In some embodiments, the laser beam 210a or the laser marking platform 210 is displaced to form the mark on the backside film 212. In some embodiments, the laser beam 210a or the laser marking platform 210 is moved in accordance with the mark to be formed on the backside film 212.

In some embodiments, a portion of the backside film 212 corresponding to the mark to be formed on the backside film 212 is heated by the laser beam 210a, and thus the mark is formed on the backside film 212. As the laser beam is directly projected on the backside film 212 to form the mark, residue on or adjacent to the mark can be minimized or even be prevented.

In some embodiments, the die 202 engraved with the mark is unloaded from the laser marking platform 210, and another die 202 is unloaded from the second carrier 207 and placed on the laser marking platform 210 for laser marking operation.

Figure 2I:
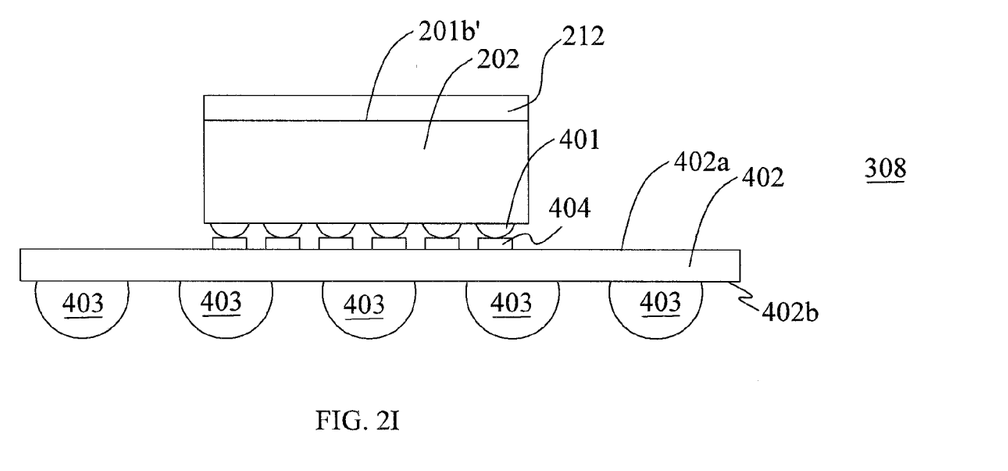
FIG. 2I is a schematic view of a die bonded with a substrate in accordance with some embodiments.

In operation 308, the die 202 engraved with the mark on the backside film 212 is mounted on a substrate 402 by several conductive die bumps 401 as in FIG. 2I. In some embodiments, no residue is present around the mark formed on the backside film 212 disposed on the backside 201b' of the die 202. The mark on the backside film 212 can be clearly seen.

In some embodiments, the substrate 402 is a printed circuit board (PCB). In some embodiments, the substrate 402 includes several bond pads 404 on a first surface 402a and several conductive substrate bumps 403 disposed on a second surface 402b and arranged in a ball grid array.

In some embodiments, the conductive die bumps 401 disposed on the frontside 201 of the die 202 are bonded with the bond pads 404 of the substrate 402 by a reflow operation. In some embodiments, the conductive die bumps 401 are electrically connect the die 202 with the substrate 402.

In some embodiments, an underfill material is disposed around the conductive bumps 401. In some embodiments, the die 202 is mounted on the substrate 402 to become a semiconductor package such as flip chip ball grid array (FCBGA) package. In some embodiments, the conductive substrate bumps 403 are configured for mounting on and bonding with another substrate or PCB.

In the present disclosure, a method of manufacturing a semiconductor device includes marking on a backside film disposed on a backside of a die after singulating a number of dies from a wafer. As the marking operation is undergone after the die sawing operation and the mark is engraved on the die individually. As the dies are marked by a laser beam one by one, the mark can be engraved on the die singulated from a very thin and high warpage wafer. The method in the present disclosure can be applied on the thin and high warpage wafer.

In addition, the mark manufactured by the method of the present disclosure would not have a residue issue, as the laser beam would not project on the backside film through a dicing tape. The laser beam projects on the backside film directly to engrave the mark. The mark including words or logos could be nicely engraved on the backside film disposed on the backside of the die without any residue on or around the mark. A quality of the marking is improved.

In some embodiments, a method of manufacturing a semiconductor device includes providing a wafer, grinding a backside of the wafer, disposing a backside film on the backside of the wafer, cutting the wafer to singulate a plurality of dies from the wafer, and forming a mark on the backside film disposed on each of the plurality of dies by a laser operation.

In some embodiments, the forming the mark includes projecting a laser beam directly on the backside film. In some embodiments, the forming the mark includes loading the plurality of dies one by one to a predetermined position.

In some embodiments, the forming the mark includes engraving the mark with a depth of about 0.001 um to about 50 um from the backside film. In some embodiments, the method further includes temporarily bonding the wafer on a first carrier by a dicing tape. In some embodiments, the disposing the backside film includes disposing the backside film permanently on the backside of the die.

In some embodiments, the disposing the backside film includes curing the backside film. In some embodiments, the mark formed on the backside film has a depth uniformity of less than 20 um.

In some embodiments, the mark has a depth of less than about 10 um from the backside film. In some embodiments, the backside film has a surface roughness of less than about 5 um. In some embodiments, the backside film includes epoxy, polymer or polyimide.

In some embodiments, a method of manufacturing a semiconductor device includes providing a wafer including a backside and a backside film disposed on the backside, mounting the wafer on a first carrier by a dicing tape, singulating a plurality of dies from the wafer disposed on the first carrier, loading the plurality of dies one by one from the first carrier to a second carrier, transporting the second carrier carrying the plurality of dies, loading the plurality of dies one by one from the second carrier to a marking platform, and laser engraving a mark on the backside film disposed on the backside of each of the plurality of dies.

In some embodiments, the laser engraving the mark includes exposing the backside film to a laser beam with a wavelength of about 200 nm to about 600 nm. In some embodiments, the loading the plurality of dies from the first carrier to the second carrier includes placing each of the plurality of dies into a cavity of the second carrier and winding the second carrier carrying the plurality of dies on a reel.

In some embodiments, the first carrier is a dicing ring or the second carrier is a carrier tape. In some embodiments, the method further includes inspecting the plurality of dies by an infra red (IR) after the laser engraving the mark on the backside film.

In some embodiments, a method of manufacturing a semiconductor device includes providing a wafer including a backside, disposing a backside film on the backside of the wafer, curing the backside film, sawing a plurality of dies from the wafer, placing a first die of the plurality of dies on a laser marking platform, laser marking on the backside film disposed the first die, unloading the first die from the laser marking platform, placing a second die of the plurality of dies on the laser marking platform, laser marking on the backside film disposed on the second die, and unloading the second die of the plurality of dies from the laser marking platform.

In some embodiments, the laser marking includes displacing a laser beam or the laser marking platform to form a mark on the backside film. In some embodiments, the laser marking includes heating a portion of the backside film corresponding to a mark to be formed on the backside film. In some embodiments, the wafer has a thickness of less than 250 um.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    providing a wafer;
    grinding a backside of the wafer;
    disposing a backside film on the backside of the wafer;
    cutting the wafer to singulate a plurality of dies from the wafer;
    placing the plurality of dies into cavities of a carrier respectively;
    picking out one of the plurality of dies from one of the cavities of the carrier, and placing the one of the plurality of dies at a marking platform; and
    forming a mark on the backside film disposed on the one of the plurality of dies by a laser operation.

2. The method of claim 1, wherein the forming the mark includes projecting a laser beam directly on the backside film.

3. The method of claim 1, wherein the forming the mark includes loading the plurality of dies one by one to a predetermined position.

4. The method of claim 1, wherein the forming the mark includes engraving the mark with a depth of about 0.001 um to about 50 um from the backside film.

5. The method of claim 1, further comprising temporarily bonding the wafer on a first carrier by a dicing tape prior to the cutting the wafer.

6. The method of claim 1, wherein the disposing the backside film includes disposing the backside film permanently on the backside of the wafer.

7. The method of claim 1, wherein the backside film is a non-cured backside film.

8. The method of claim 1, wherein the mark formed on the backside film is absent from a residue disposed on or adjacent to the mark.

9. The method of claim 1, wherein the mark has a depth of less than about 10 um from the backside film.

10. The method of claim 1, wherein the backside film has a surface roughness of less than about 5 um.

11. The method of claim 1, wherein the backside film includes epoxy, polymer or polyimide.

12. A method of manufacturing a semiconductor device, comprising:
    providing a wafer including a backside and a backside film disposed on the backside;
    mounting the wafer on a first carrier by a dicing tape;
    singulating a plurality of dies from the wafer disposed on the first carrier;
    loading the plurality of dies one by one from the first carrier to cavities of a second carrier respectively;
    transporting the second carrier carrying the plurality of dies;
    loading the plurality of dies one by one from the cavities of the second carrier to a marking platform; and
    laser engraving a mark on the backside film disposed on the backside of each of the plurality of dies on the marking platform.

13. The method of claim 12, wherein the laser engraving the mark includes exposing the backside film to a laser beam with a wavelength of about 200 nm to about 600 nm.

14. The method of claim 12, wherein the loading the plurality of dies from the first carrier to the second carrier further includes winding the second carrier carrying the plurality of dies on a reel.

15. The method of claim 12, wherein the first carrier is a dicing ring or the second carrier is a carrier tape.

16. The method of claim 12, further comprising inspecting the plurality of dies by an infra red (IR) after the laser engraving the mark on the backside film.

17. A method of manufacturing a semiconductor device, comprising:
    providing a wafer including a backside;
    disposing a backside film on the backside of the wafer;
    curing the backside film;
    sawing a plurality of dies from the wafer;
    placing a first die of the plurality of dies into a first cavity of a carrier;
    placing a second die of the plurality of dies into a second cavity of the carrier;
    picking out the first die from the first cavity of the carrier and placing the first die on a laser marking platform;
    laser marking on the backside film disposed on the first die;
    unloading the first die from the laser marking platform;
    picking out the second die from the second cavity of the carrier and placing the second die on the laser marking platform;
    laser marking on the backside film disposed on the second die; and
    unloading the second die from the laser marking platform.

18. The method of claim 17, wherein the laser marking includes displacing a laser beam or the laser marking platform to form a mark on the backside film.

19. The method of claim 17, wherein the laser marking includes heating a portion of the backside film corresponding to a mark to be formed on the backside film.

20. The method of claim 17, wherein the wafer has a thickness of less than 250 um.

* * * * *